United States Patent
Wang et al.

(10) Patent No.: US 10,066,800 B1
(45) Date of Patent: Sep. 4, 2018

(54) LIGHT-EMITTING DIODE FIXING APPARATUS

(71) Applicant: KEEPER TECHNOLOGY CO., LTD., New Taipei (TW)

(72) Inventors: Tiger Wang, New Taipei (TW); Chiu Mei Liao, New Taipei (TW); Chung-Hsien Kuo, New Taipei (TW)

(73) Assignee: KEEPER TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/711,710

(22) Filed: Sep. 21, 2017

(51) Int. Cl.
| | | |
|---|---|---|
| *F21S 41/147* | (2018.01) | |
| *F21S 41/19* | (2018.01) | |
| *F21S 8/10* | (2006.01) | |
| *H01L 33/64* | (2010.01) | |
| *H01R 13/516* | (2006.01) | |
| *F21V 19/00* | (2006.01) | |

(52) U.S. Cl.
CPC ........... *F21S 41/192* (2018.01); *F21S 41/147* (2018.01); *F21S 48/1109* (2013.01); *F21S 48/1159* (2013.01); *F21V 19/0055* (2013.01); *H01L 33/644* (2013.01); *H01R 13/516* (2013.01)

(58) Field of Classification Search
CPC ...... F21S 41/192; F21S 41/147; H01R 13/516
See application file for complete search history.

(56) References Cited

U.S. PATENT DOCUMENTS

| | | | |
|---|---|---|---|
| 7,290,913 | B2 | 11/2007 | Watanabe et al. |
| 7,750,458 | B2 | 7/2010 | Takeda et al. |
| 7,901,123 | B2 | 3/2011 | Takeda et al. |
| 8,016,469 | B2 | 9/2011 | Takeda et al. |
| 8,328,401 | B2 | 12/2012 | Matsunaga |
| 8,523,416 | B2 | 9/2013 | Ohmi et al. |
| 8,602,619 | B2 | 12/2013 | Matsunaga |
| 8,801,251 | B2 | 8/2014 | Ohmi et al. |
| 9,035,346 | B2 | 5/2015 | Matsunaga et al. |

FOREIGN PATENT DOCUMENTS

| | | |
|---|---|---|
| CN | 202266955 | 6/2012 |
| TW | M460990 | 9/2013 |
| TW | M498387 | 4/2015 |
| TW | 201516317 | 5/2015 |
| TW | M513329 | 12/2015 |
| TW | M514537 | 12/2015 |

OTHER PUBLICATIONS

English Abstracts for TWM460990, TWM514537, TW201516317, TWM496387, TVVM513329, and CN202266955.

*Primary Examiner* — Joseph L Williams
(74) *Attorney, Agent, or Firm* — Lynette Wylie; Apex Juris, pllc.

(57) ABSTRACT

A light-emitting diode (LED) fixing apparatus includes a base, a first fixing member, a second fixing member, a terminal and an LED board. Upon assembly of the LED fixing apparatus, the LED board is mounted on the base, the first fixing member and the second fixing member are mounted on the base from two ends of the base, two first positioning portions of the first fixing member and two second positioning portions of the second fixing member are provided for the LED board to be rested thereon. Moreover, a first bevel block and a second bevel block of the base can lift up a first terminal portion and a second terminal portion of the terminal to prevent LED die or substrate of the LED board from being scratched when the second fixing member is mounted. Mutual element engagement ensures that the assembly process is fool-proof and speedy.

12 Claims, 11 Drawing Sheets

LIGHT-EMITTING DIODE FIXING APPARATUS

BACKGROUND OF THE INVENTION

1. Field of the Invention

The present invention relates to a light-emitting diode (LED) fixing apparatus and, more particularly, to an LED fixing apparatus for a vehicular headlight.

2. Description of the Related Art

With reference to FIG. 11, light sources in current vehicular headlights usually adopt an LED board 90, which includes a sheet-like ceramic circuit board 91, a substrate 93 with LED dice mounted thereon, and two electrodes 95. The substrate 93 is mounted on the ceramic circuit board 91. The two electrodes 95 are formed on two opposite edge portions of the ceramic circuit board 91 and are electrically connected to the substrate 93. The LED board 90 is mounted on a fixing base 70 inside a vehicular headlight. The fixing base 70 has multiple positioning pins 72 formed on a top of the first fixing base 70 and surrounding an area of the top of the fixing base 70 that corresponds to the shape of the LED board 90, such that the LED board 90 and the ceramic circuit board 91 can be horizontally positioned by the positioning pins 72 after the LED board 90 is mounted in the first fixing base 70.

After the LED board 90 is mounted on the first fixing base 70, a fixing cover 80 is further mounted on a top of the LED board 90 for the LED board 90 to be sandwiched between the fixing base 70 and the fixing cover 80. The fixing cover 80 includes a holding portion 81 and the connector 83. The connector 83 is formed on one edge portion of the holding portion 81. The holding portion 81 has an opening 810, multiple limiting pieces 84 and two electrical contacts 85. The opening 810 is formed through the holding portion 81. The multiple limiting pieces 84 are formed on and protrude inwardly from an inner wall of the opening 810. The two electrical contacts 85 are mounted on two opposite portion of the inner wall of the opening 810 and correspond to the respective electrodes 95 in position. One end of each electrical contact 85 is extended into the connector 83 and is electrically connected to a terminal 86 mounted inside the connector 83. After the fixing cover 80 is mounted on the LED board 90, the two electrical contacts 85 are pressed down to contact the respective electrodes 95 of the LED board 90 to electrically connect the substrate 93 and the terminals 86. Meanwhile, after the fixing cover 80 is mounted, the limiting pieces 84 hold a perimeter of the ceramic circuit boar 91 to prevent the LED board 90 from coming off the fixing cover 80.

However, the way of fixing the LED board 90 using the fixing base 70 and the fixing cover 80 has the following drawbacks.

1. The fixing cover 90 mounted on the LED board 90 is bulky and lengthy and is thin and at a central portion thereof, and is therefore vulnerable to deformation when subject to stress.

2. After the LED board 90 is placed on the fixing base 70, during the course of mounting the fixing cover 80, as there is no positioning element available to the fixing cover 80 for positioning and aligning the LED board 90, the limiting pieces 84 and the electrical contacts 85 may scratch the LED dice on the substrate 93.

3. The positioning pins 72 on the fixing base 70 are integrally formed with the fixing base 70. When the fixing base 70 is manufactured, residual sericin may be caused when those tiny positioning pins 72 are formed by a cutting process.

4. After manufactured or operated for a while, the positioning pins 72 are prone to defects or fracture that fails to accurately position the LED board 90.

SUMMARY OF THE INVENTION

An objective of the present invention is to provide a light-emitting diode (LED) fixing member adopting two fixing members to fasten two opposite ends of the LED module, ensuring no scratch and damage on the LED module and efficiency and simplification in assembly process.

To achieve the foregoing objective, the LED fixing apparatus includes a base, a first fixing member, a second fixing member, a terminal and an LED board;

The base has a top and four engagement slots. The four engagement slots are formed in two opposite lateral surfaces of the base facing forwards and rearward respectively.

The first fixing member is mounted on the lateral surface of the base facing rearwards and has two first engagement arms and a first pressing portion.

The two first engagement arms are formed on and protrude forwards along a longitudinal direction from a lateral surface of the first fixing member facing forwards, are spaced apart from each other, and are respectively inserted into two of the four engagement slots.

The first pressing portion is formed on and protrudes from the lateral surface of the first fixing member on which the first engagement arms are formed.

The second fixing member is mounted on the lateral surface of the base facing forwards and has two second engagement arms, a connection port and a second pressing portion.

The two second engagement arms are formed on and protrude rearwards from a lateral surface of the second fixing member facing rearwards, are spaced apart from each other, and are inserted into the other two of the four engagement slots.

The connection port is formed on a longitudinal surface of the second fixing member differing from the lateral surface of the second fixing member.

The second pressing portion is formed on and protrudes forwards from the lateral surface of the second fixing member on which the second engagement arms are formed.

The terminal is mounted in the second fixing member and has an insertion portion, a connection portion, a first terminal portion and a second terminal portion.

The insertion portion is mounted through the connection port of the second fixing member and is exposed from an opening of the connection port.

The connection portion has two ends. One end of the connection portion is connected to the insertion portion.

The first terminal portion is connected to the other end of the connection portion.

The second terminal portion is connected to the insertion portion.

The LED board is mounted on the base and has a substrate, an LED die and two electrodes.

The substrate is mounted on the base.

The LED die is mounted on the substrate.

The two electrodes are respectively mounted on two opposite portion on the substrate in the longitudinal direction.

The first fixing member and the second fixing member are securely held on two opposite portions of the LED board for the first terminal portion and the second terminal portion to abut against the respective electrodes for supplying power to the LED board through the electrodes.

The LED fixing apparatus is advantageous in the first fixing member and the second fixing member that improve the drawbacks generated by the lengthy conventional fixing cover disclosed. As a result, deformation of the fixing cover arising from its lengthy shape can be avoided. Meanwhile, as the first fixing member and the second fixing member are mounted on the base from two ends of the base and extend toward a central portion of the LED board to fasten the central portion of the LED board, it is unnecessary for the first fixing member and the second fixing member to align as required in conventional technique, and inadvertent scratch on the LED can be reduced because the first fixing member and the second fixing member mounted from two sides basically cause no view blockage of the LED board. Additionally, because of the structure of the first engagement arms and the second engagement arms, assembly of the LED fixing apparatus can be rapid and convenient.

Other objectives, advantages and novel features of the invention will become more apparent from the following detailed description when taken in conjunction with the accompanying drawings.

DETAILED DESCRIPTION OF THE INVENTION

Figure 1:
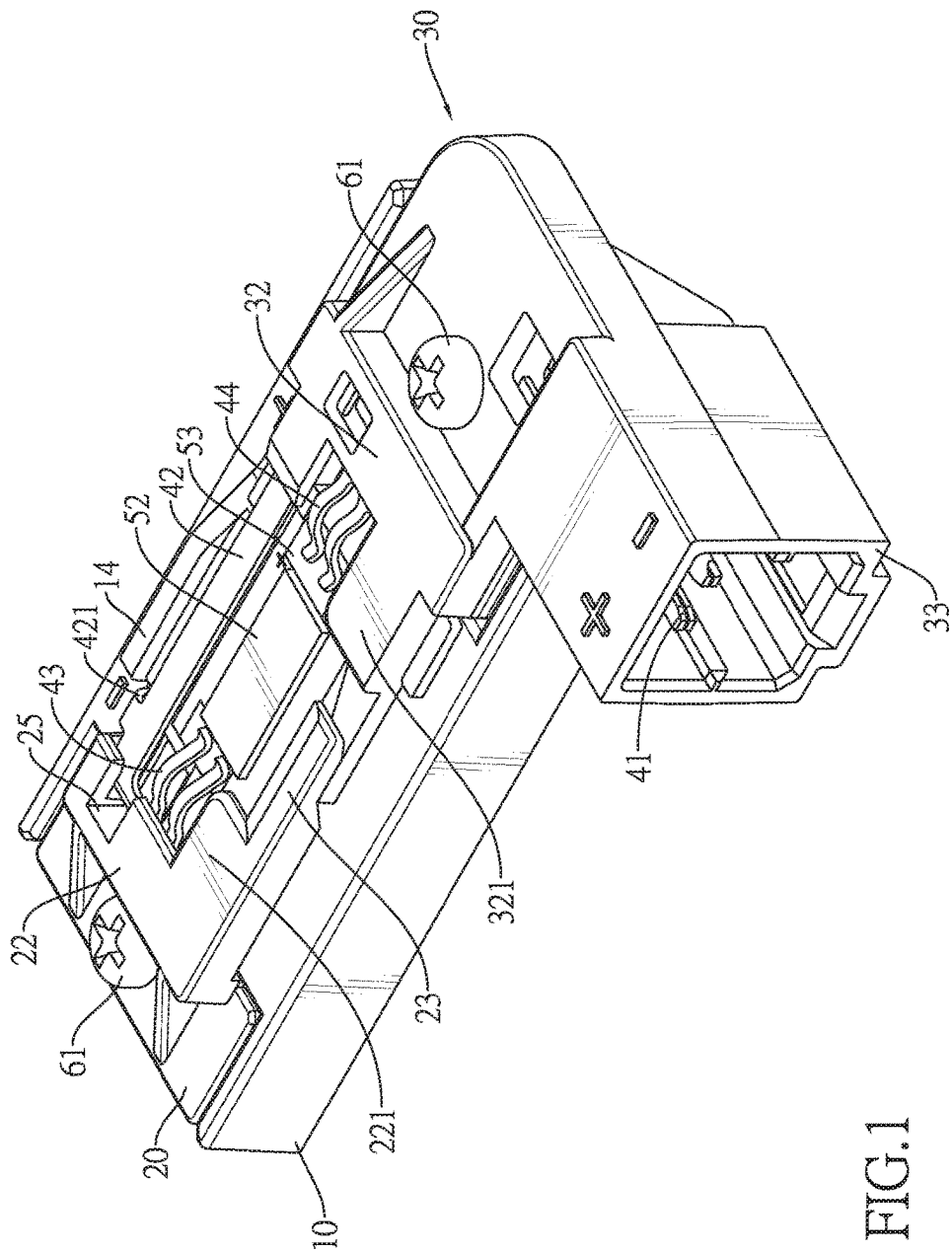
FIG. 1 is an LED fixing apparatus in accordance with the present invention.
Figure 2:
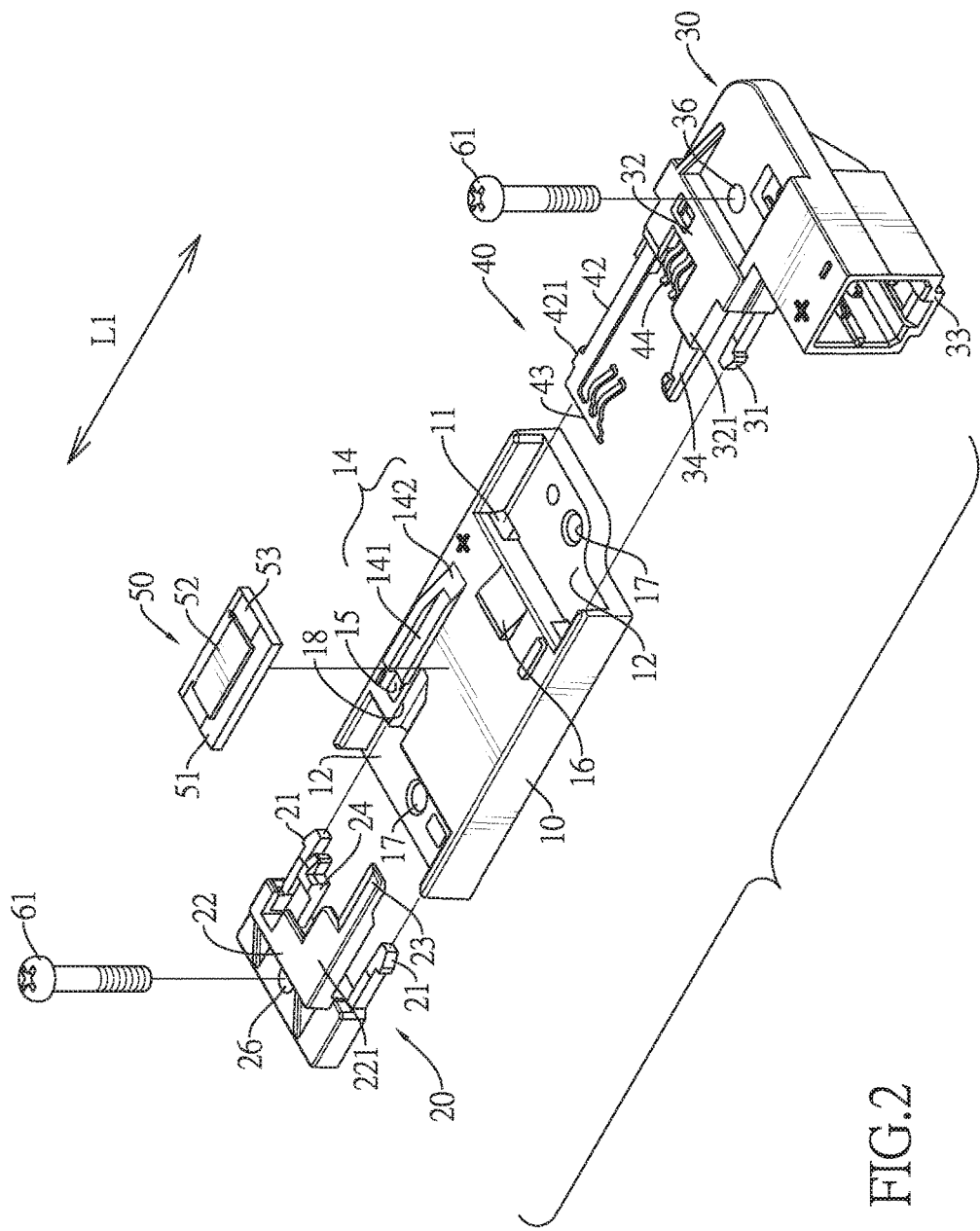
FIG. 2 is an exploded perspective view of the LED fixing apparatus in FIG. 1.
Figure 5:
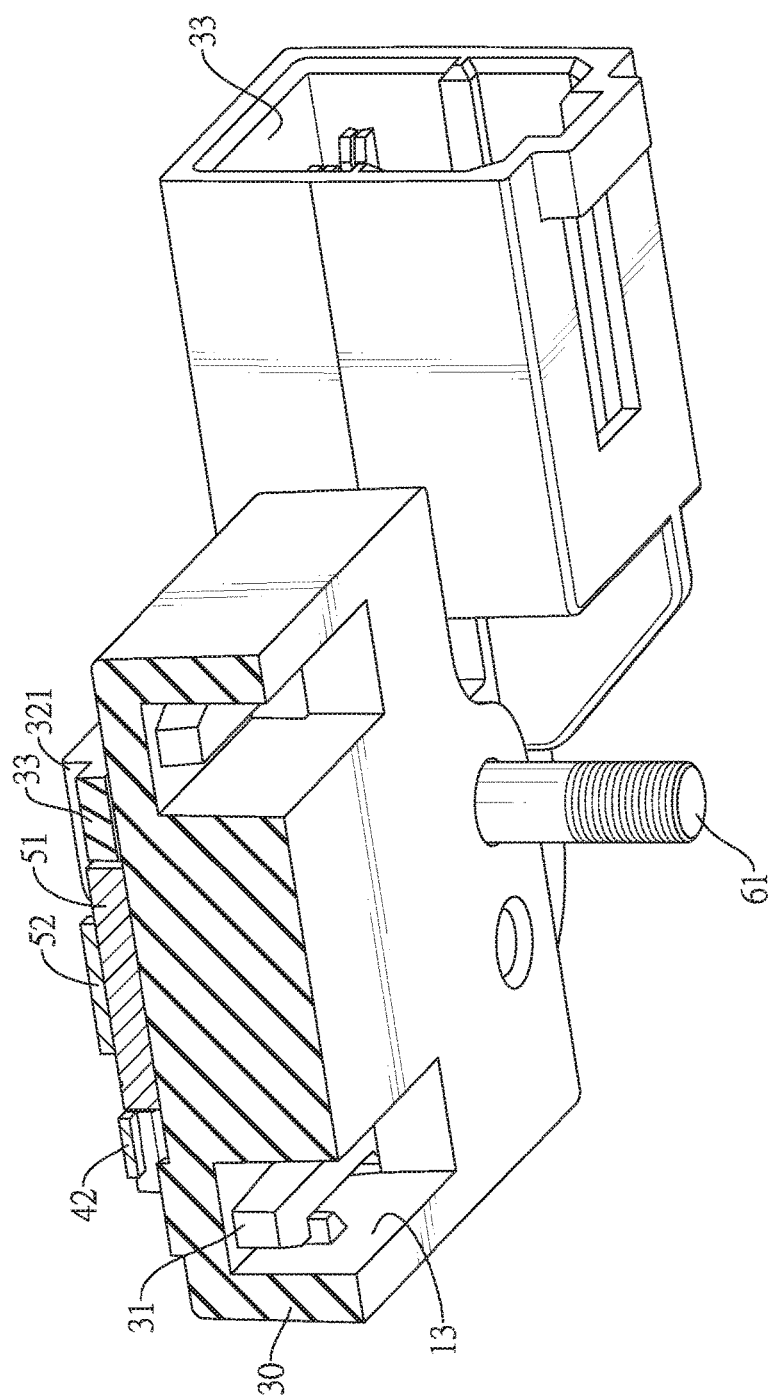
FIG. 5 is a perspective view of the LED fixing apparatus in FIG. 1 with a second fixing member partially sectioned.

With reference to FIGS. 1, 2 and 5, a light-emitting diode (LED) fixing apparatus in accordance with the present invention includes a base 10, a first fixing member 20, a second fixing member 30, a terminal 40 and an LED board 50.

The base 10 may take the form of including but not limited to a rectangular block, and has two recesses 12, four engagement slots 11, four channels 13, a first bevel block 14, an ear slot 15, a second bevel block 16, two fastening holes 17 and a positioning groove 18. A longitudinal direction and a lateral direction of the base 10 are respectively defined as L1 and a direction perpendicular to L1. A forward direction is defined as a direction from the first fixing member 20 to the second fixing member 30 in the longitudinal direction, and a rearward direction is opposite to the forward direction.

Figure 6:
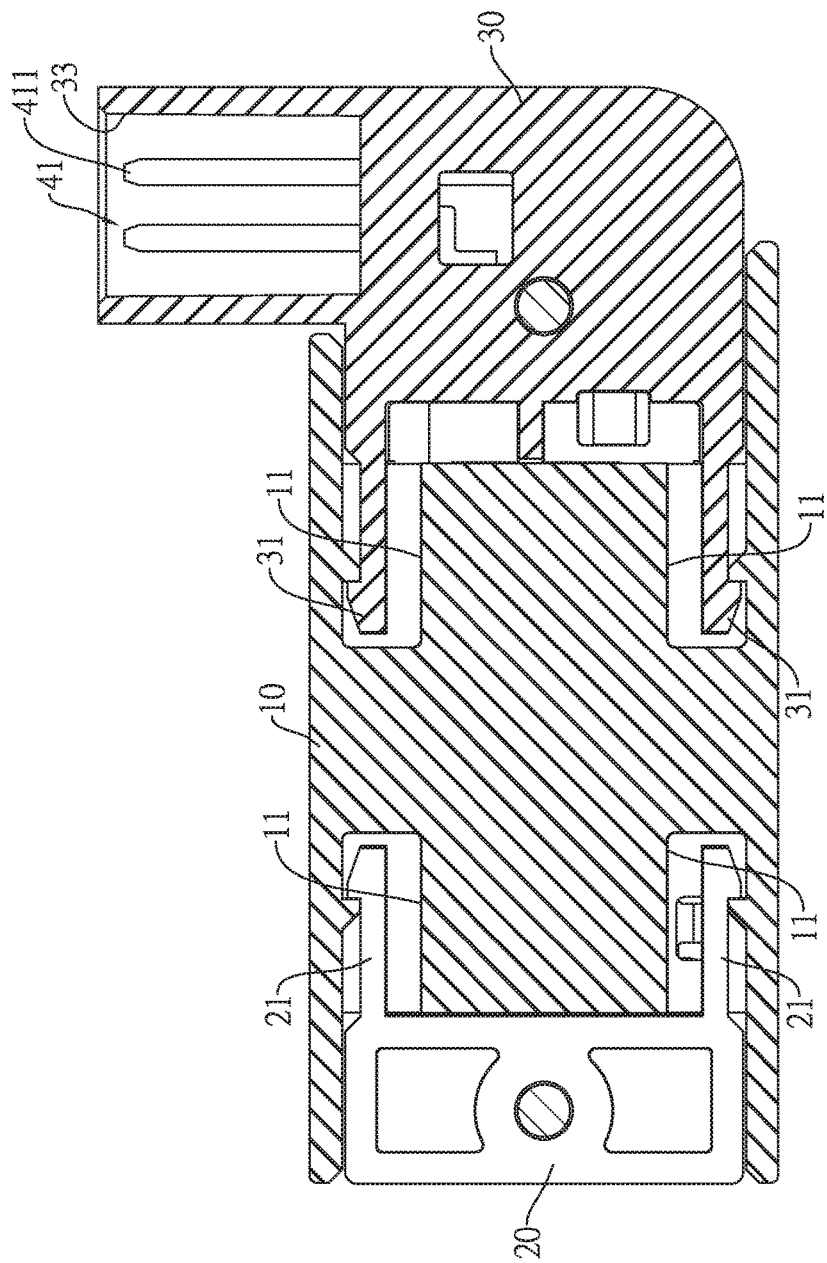
FIG. 6 is a top view in section of the LED fixing apparatus in FIG. 1.

With reference to FIGS. 2 and 6, the two recesses 12 are formed in a front portion and a rear portion of a top of the base 10, and two of the four engagement slots 11 are formed in a lateral inner wall of the recess 12 in the front portion of the base 10 and another two of the four engagement slots 11 are formed in a lateral inner wall of the recess 12 in the rear portion of the base 10.

Figure 9:
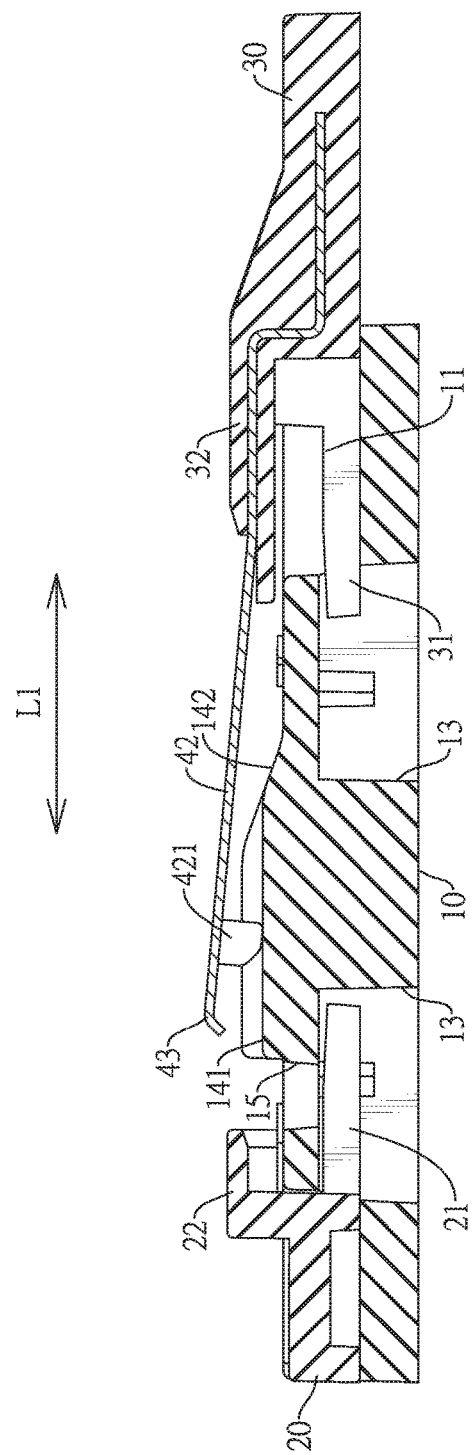
FIG. 9 is a cross-sectional view of the LED fixing apparatus in FIG. 1 when the second fixing member is mounted.

With reference to FIGS. 5 and 9, the four channels 13 are formed in a bottom of the base 10 and correspond to and communicate with the respective engagement slots 11 located above the channels 13.

With reference to FIGS. 2 and 9, the first bevel block 14 is formed on and protrudes from the top of the base 10, and extends forwards. In the present embodiment, the first bevel block 14 has a bevel portion 141 and a flat portion 142. A top end of the bevel portion 141 may be connected with a front end of the flat portion 142. Alternatively, the first bevel block 14 may be a bevel block integrally without any flat portion at all. The ear slot 14 is formed in the top of the base 10 and is adjacent to a rear end of the flat portion 142 of the first bevel block 14.

With further reference to FIG. 2, the second bevel block 16 is obliquely formed on the top of the base and is adjacent to the lateral inner wall of the recess 12 in the front portion of the base 10. Both the first bevel block 14 and the second bevel block 15 descend forwards. Each of the two fastening holes 17 is formed in a bottom of a corresponding recess 12. The positioning groove 18 is formed in the lateral inner wall of the recess 12 in the rear portion of the base 10.

With reference to FIGS. 1 and 2, the first fixing member 20 and the second fixing member 30 are respectively mounted in the recesses in the rear portion and the front portion of the base 10 along the longitudinal direction L1.

With reference to FIGS. 2 and 9, the first bevel block 14 and the second bevel block 16 descend in a direction from the first fixing member 20 to the second fixing member 30. Specifically, the flat portion 142 of the first bevel block 14 extends in a forward direction from the first fixing member 20 to the second fixing member 30 and the bevel portion 141 descend in the forward direction.

Figure 7:
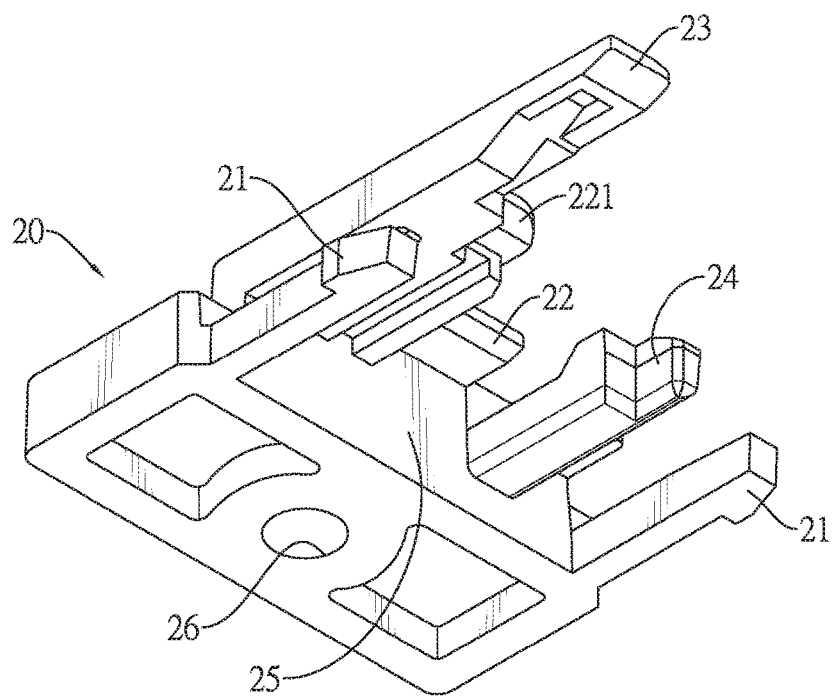
FIG. 7 is a perspective view of a first fixing member of the LED fixing apparatus in FIG. 1.

With reference to FIGS. 2 and 7, the first fixing member 20 has two first engagement arms 21, a first pressing portion 22, a first connection arm 23, two first positioning portions 24, a terminal-receiving chamber 25 and a first positioning hole 26.

With further reference to FIG. 6, the two first engagement arms 21 are formed on and protrude forwards from a lateral surface of the first fixing member 20 facing forwards and are respectively inserted into the two engagement slots 11 in the rear portion of the base 10 to fasten the first fixing member 20 and the base 10 together. The first positioning hole 26 of the first fixing member 20 corresponds to a corresponding fastening hole 17 of the base 10. In the present embodiment, a bolt 61 is mounted through the corresponding fastening hole 17 and first positioning hole 26 to further firmly combine the base 10 and the first fixing member 20. However, elements other than the bolt 61 can be used to securely mount through the corresponding fastening hole 17 and the first positioning hole 26, or only the two first engagement arms 21 are used to fix the first fixing member 20 at the absence of the fastening holes 17 and the first positioning holes 26.

With reference to FIG. 7, the first pressing portion 22, the first connection arm 23 and the two first positioning portions 24 are all formed on and protrude forwards from the lateral surface of the first fixing member 20 on which the first engagement arms 21 are formed.

Figure 3:
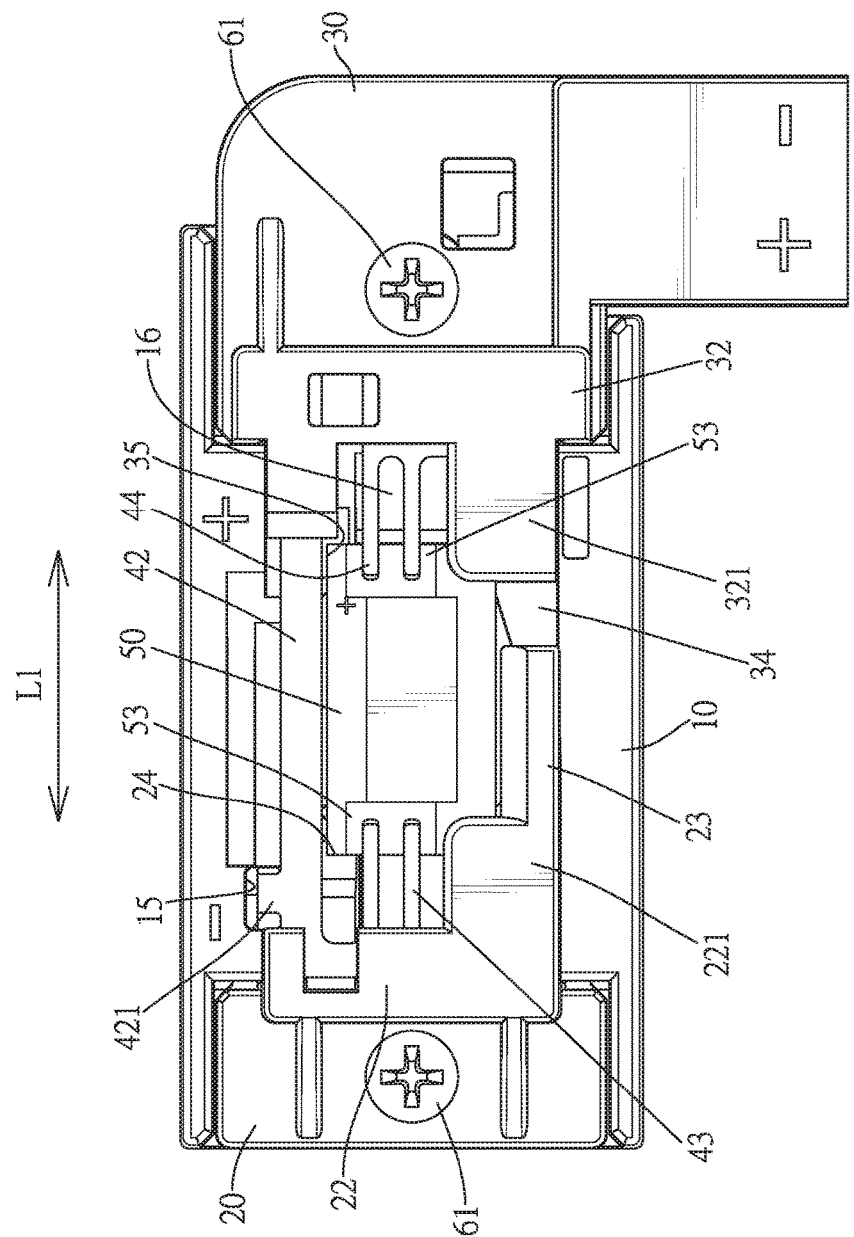
FIG. 3 is a top view of the LED fixing apparatus in FIG. 1.

With reference to FIGS. 1, 2 and 3, the first pressing portion 22 has a first pressing plate 221 formed on and extending forwards from a front end of the first pressing portion 22. The first pressing plate 221 extends in a same direction as those of the first engagement arms 21 and the first pressing portion 22 and can be treated as an extension plate extending forwards from the first pressing portion 22. The terminal-receiving chamber 25 is formed in a bottom of the first pressing portion 22. In the present embodiment, the first pressing portion 22 and the first pressing plate 221 are but are not limited to be sheet-shaped.

In the present embodiment, the first connection arm 23 is formed on and protrudes forwards from a front end of the first pressing plate 221. Alternatively, the first connection arm 23 may be formed on other position of the first fixing member 20. As to the two first positioning portions 24, one of the two first positioning portions 24 is but is not limited to be formed on the first connection arm 23 and may be directly formed on the first fixing member 20. The two first positioning portions 24 are parallelly spaced apart from each other, and the one of the two first positioning portions 24 is slightly higher than the other first positioning portion 24. The lower first positioning portion 24 is formed inside the terminal-receiving chamber 25, is lower than the first pressing portion 22, and extends into the positioning groove 18 of the base 10.

Figure 8:
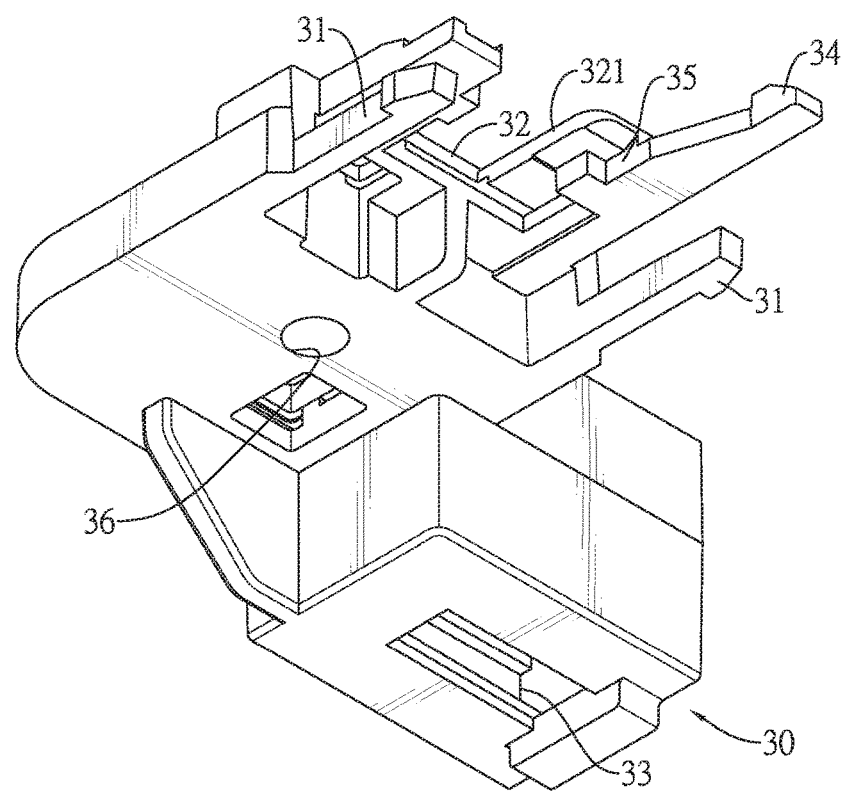
FIG. 8 is a perspective view of the second fixing member of the LED fixing apparatus in FIG. 1.

With reference to FIGS. 2 and 8, the second fixing member 30 is mounted in the recess 12 in the front portion of the base 10 and includes two second engagement arms 31, a second pressing portion 32, a connection port 33, a second connection arm 34, two second positioning portions 35 and a second positioning hole 36.

The two second engagement arms 31 are formed on and protrude rearwards from a lateral surface of the second fixing member 30 facing rearwards and are respectively inserted into the two engagement slots 11 in the front portion of the base 10 to fasten the second fixing member 30 and the base 10 together. The second positioning hole 36 of the second fixing member 30 corresponds to a corresponding fastening hole 17 of the base 10. In the present embodiment, a bolt 61 is mounted through the corresponding fastening hole 17 and second positioning hole 36 to further firmly combine the base 10 and the second fixing member 30. However, elements other than the bolt 61 can be used to securely mount through the corresponding fastening hole 17 and the second positioning hole 36, or only the two second engagement arms 31 are used to fix the second fixing member 30 at the absence of the fastening holes 17 and the second positioning holes 36.

With reference to FIG. 8, the second pressing portion 32, the second connection arm 34 and the two second positioning portions 35 are all formed on and protrude forwards from the lateral surface of the second fixing member 30 on which the second engagement arms 31 are formed.

With reference to FIGS. 1, 2 and 3, the second pressing portion 32 has a second pressing plate 321 formed on and extending rearwards from a rear end of the second pressing portion 32. The second pressing plate 321 extends in a same direction as those of the second engagement arms 31 and the second pressing portion 32 and can be treated as an extension plate extending rearwards from the second pressing portion 32. In the present embodiment, the second connection arm 34 is formed on and protrudes rearwards from a rear end of the second pressing plate 321. Alternatively, the second connection arm 34 may be formed on other position of the second fixing member 30.

The second connection arm 34 and the first connection arm 23 of the first fixing member 20 may be detachably connected. In the present embodiment, the first connection arm 23 and the second connection arm 34 may respectively have a catch end and a hook end of a buckle connector for the first connection arm 23 and the second connection arm 34 to engage each other. The first connection arm 23 and the second connection arm 34 may be connected by other means. Besides, the first connection arm 23 and the second connection arm 34 target at providing secure connection between the first fixing member 20 and the second fixing member 30 and are optional elements.

With further reference to FIG. 2, the connection port 33 is formed on a longitudinal surface of the second fixing member 30, which is perpendicular to the lateral surface of the second fixing member 30 facing rearwards. In the present embodiment, the second pressing portion 32 and the second pressing plate 321 are but are not limited to be sheet-shaped. Taken as an example but not a limitation of the two second positioning portions, one of the second positioning portions 35 is formed on the second connection arm 34, and the other second positioning portion 35 is formed on the second pressing portion 32. The two second positioning portions 35 may be directly formed on the second fixing member 30.

Figure 4:
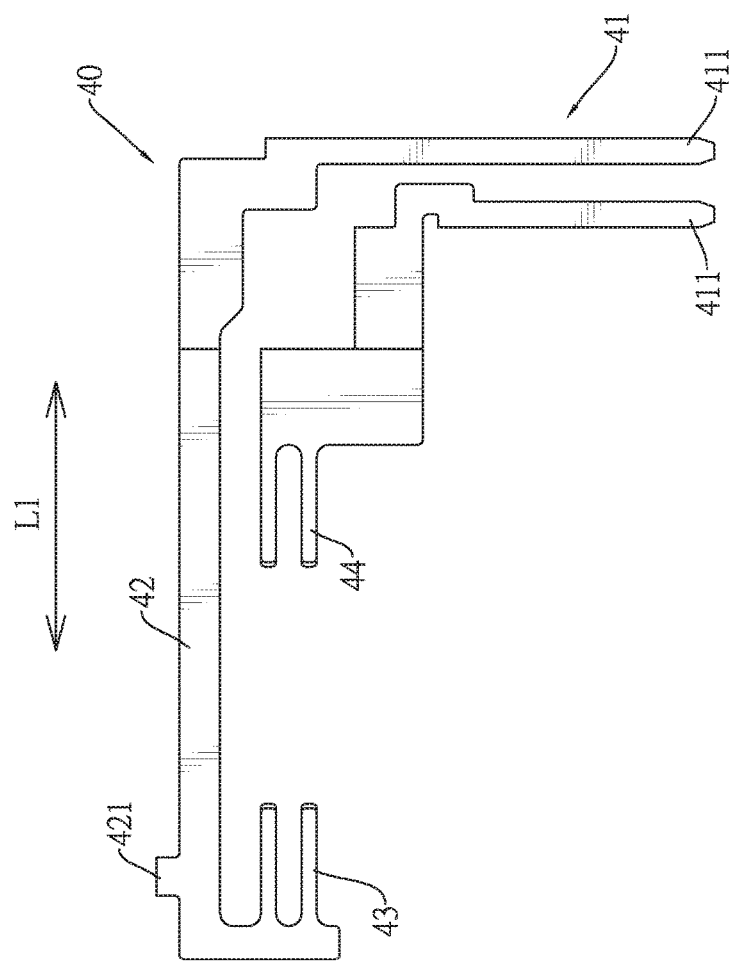
FIG. 4 is a top view of a terminal of the LED fixing apparatus in FIG. 1.

With reference to FIGS. 2 and 4, the terminal 40 is mounted in the second fixing member 30. In the present embodiment, the terminal 40 is partially wrapped around by the second fixing member 30 through injection molding. Nevertheless, the second fixing member 30 and the terminal 40 may be fastened together by other means.

With reference to FIGS. 3 and 4, the terminal 40 includes an insertion portion 41, a connection portion 42, a first terminal portion 43 and a second terminal portion 44. The insertion portion 41 is mounted through the connection port 33 of the second fixing member 30, is exposed from an opening of the connection port 33, and has two insertion terminals 411 spaced apart from each other. Two ends of the connection portion 42 are respectively connected to the first terminal portion 43 and one of the two insertion terminals 411 of the insertion portion 41. One end of the second terminal portion 44 is connected to the other insertion terminal 411 of the insertion portion 41. The first pressing portion 22 is pressed on a top of the first terminal portion 43. The second pressing portion 32 is pressed on the second terminal portion 44. In other words, the terminal 40 sequentially includes the first terminal portion 43, the connection portion 42, the second terminal portion 44 and the insertion portion 41 in the forward direction. The first terminal portion 43 and the second terminal portion 44 extend in the forward direction and the rearward direction respectively.

With reference to FIGS. 2 and 4, the connection portion 42 has an ear portion 421 formed on and protruding downwards from the connection portion 42. The ear portion 421 is slidable on the first bevel block 14 when the second fixing member 30 is mounted on the base 10, and corresponds to the ear slot 15 of the base 10 in position and is inserted into the ear slot 15 after the ear portion 421 slidably passes the first bevel block 14.

With reference to FIGS. 1 and 7, besides being pressed by the first pressing portion 22, the first terminal portion 43 of the terminal 40 is mounted inside the terminal-receiving chamber 25 of the first fixing member 20 and is held between the lower first positioning portion 24 and the first pressing portion 22.

The LED board 50 is mounted on the base 10. In the present embodiment, thermal conductive paste is sandwiched between the LED board 50 and the base 10 to dissipate heat generated by the LED board 50 and facilitate the mounting of the LED board 50 on the base 10.

With reference to FIGS. 1 and 2, the LED board 50 includes a substrate 51, an LED die 52 and two electrodes 53. The substrate 51 is mounted on the base 10. The LED die 52 is mounted on the substrate 51. The two electrodes 53 are respectively mounted on two opposite portions on the substrate 51 in the longitudinal direction L1. The first fixing member 20 and the second fixing member 30 are securely held on two opposite portions of the LED board 50 for the first terminal portion 43 and the second terminal portion 44 to abut against the respective electrodes 53 for supplying power to the LED board 50 through the electrodes 53.

Furthermore, the first pressing plate 221 and the second pressing plate 321 are respectively pressed against the opposite portions of the LED board 50. Specifically, the first pressing plate 221 and the second pressing plate 321 are pressed against the substrate 51 of the LED board 50. Because of the first pressing portion 221 and the second pressing portion 321, the LED board 50 can be firmly mounted on the base 10.

With reference to FIGS. 2 and 3, to accurately position the LED board 50, there are many positioning elements mounted around the LED board 50. For example, when the first fixing member 20 is mounted in the base 10, a rear end of the second bevel block 16 abuts against a front edge portion of the LED board 50 and front portions of the first positioning portions 24 abut against a rear edge portion of the LED board 50. The form of the front portions of the first positioning portions 24 match that of a perimeter of the LED board 50. Similarly, when the second fixing member 30 is mounted in the base 10, rear portions of the second positioning portions 35 abut against a front edge portion of the LED board.

Figure 10:
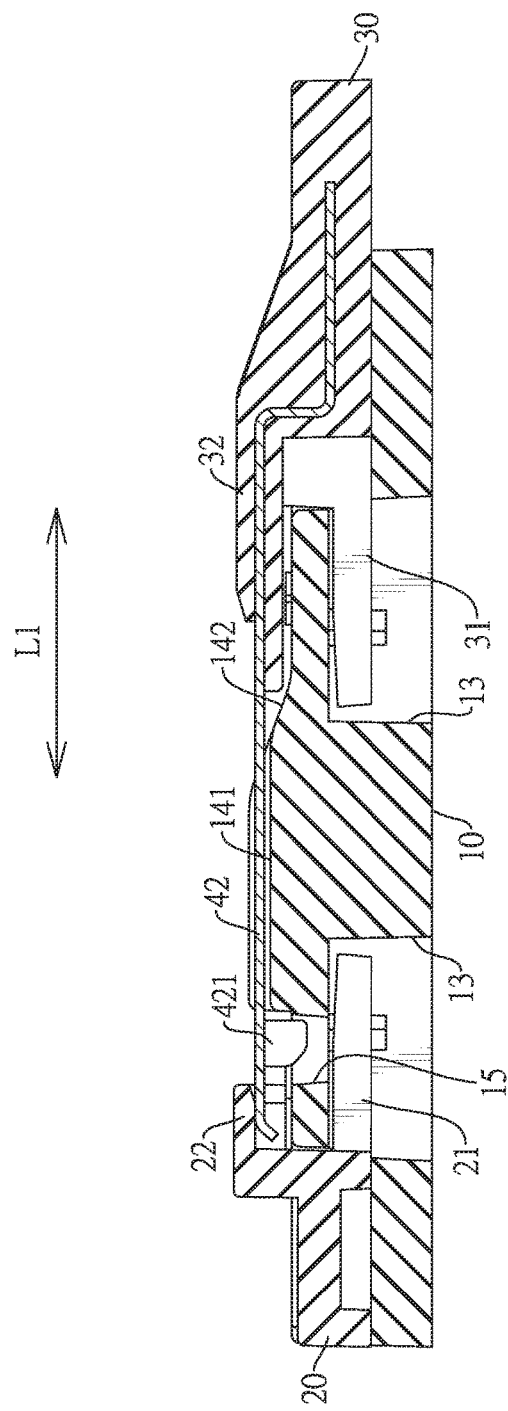
FIG. 10 is another cross-sectional view of the LED fixing apparatus in FIG. 1 when the second fixing member is mounted.
Figure 11:
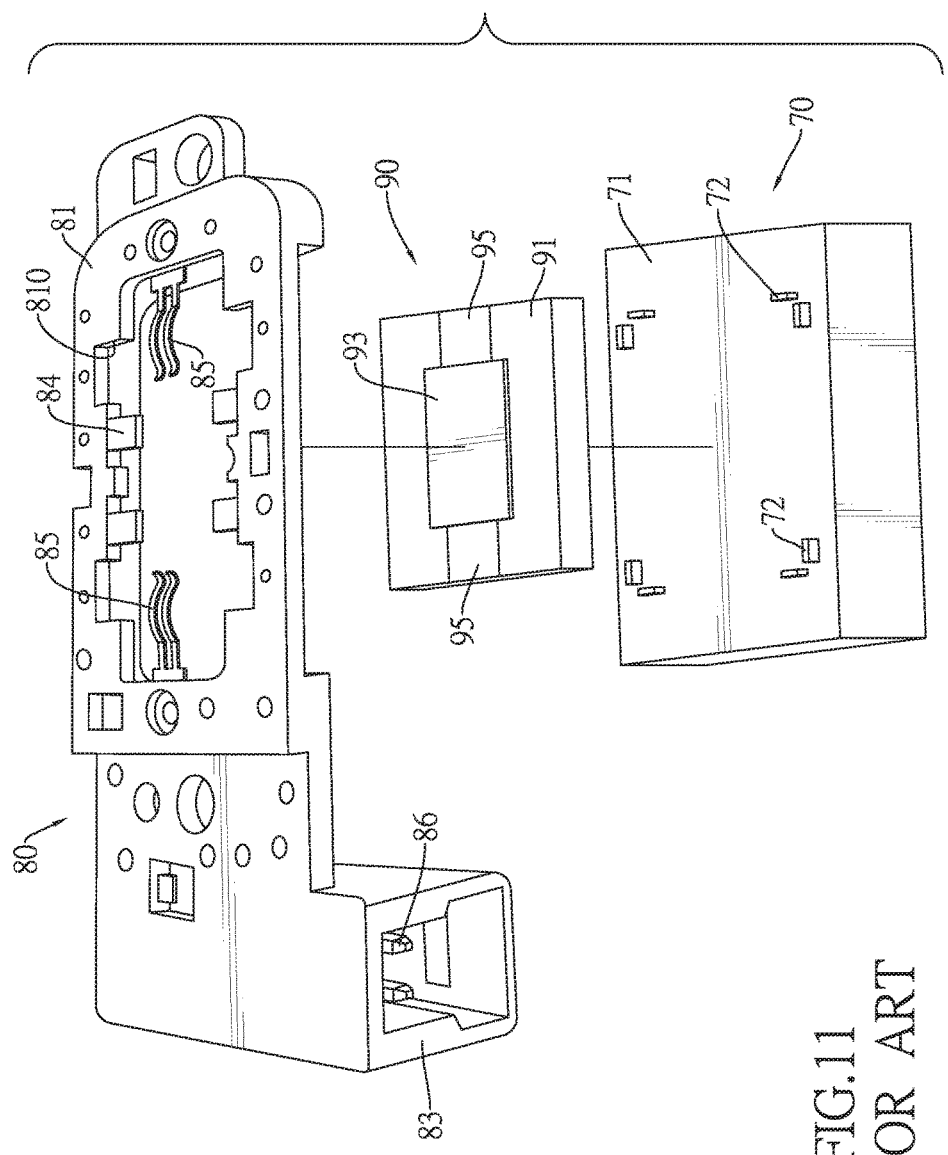
FIG. 11 is an exploded perspective view of a conventional LED fixing apparatus.

With reference to FIGS. 2, 9 and 10, upon assembly of the LED fixing apparatus, the LED board 50 is centrally mounted on the top of the base 10, and then the first fixing member 20 and the second fixing member 30 are respectively mounted on the base 10 through a rear end and a front end of the base 10 along the longitudinal direction L1. When the second fixing member 30 is mounted on the base 10, to avoid damage or scratch on the LED die 52 swept through by the first terminal portion 43 and the second terminal portion 44 of the terminal 40, the connection portion 42 of the terminal 40 is slid on and pass the first bevel block 14. At that point, the ear portion 421 of the connection portion 42 of the terminal 40 gradually ascends along the bevel surface 141 of the first bevel block 14. From a direct perspective view of the connection portion 42, the connection portion 42 is moved up toward the first fixing member 20, such that the first terminal portion 43 is also moved up and is thus hung above the LED board 50 without scratching the LED board 50. An overall length of first bevel block 14 in the longitudinal direction L1 is equal to a distance that the first terminal portion 43 can completely pass the LED board 40. After the first terminal portion 43 passes the LED board 40, the ear portion 421 is slid to an end of the flat portion 142 of the first bevel block 14 and is then separated from the first bevel block 14. Thus, the connection portion 42 is restored to its undistorted state and the first terminal portion 43 returns to its original elevation before the second fixing member 30 is mounted and is pressed against one of the electrodes 53 of the LED board 50. Meanwhile, the ear portion 421 is received in the ear slot 15 adjacent to the flat portion 142 of the first bevel block 14.

With reference to FIG. 2, the second terminal portion 44 can be assembled in a way similar to that of the first terminal portion 43. When the second fixing member 30 is mounted on the base 10, the second terminal portion 44 is slidable on the second bevel block 16 before contacting the LED board 50. The second terminal portion 44 gradually ascends along an inclined portion of the second bevel block 16 and is distorted to prevent from scratching the LED board 50 when passing through the LED board 50. After the second fixing member 30 completely is mounted in the base 10, the second terminal portion 44 is separated from the second bevel block 16, return to its normal form, and is held on the other electrode 53 of the LED board 50.

Mounting of the LED board 50 can be simplified by virtue of the first fixing member 20 and the second fixing member 30. In view of the design of the LED fixing apparatus, damage or scratch on the LED board won't become a concern upon mounting of the LED board and the assembly process of the LED board can be accelerated. Moreover, the LED fixing apparatus is structurally simple and is therefore uneasy to cause defect in production. For operation, as long as the insertion portion 41 of the terminal 40 inside the connection port 33 is connected to a power source, the LED board 50 can be normally operated. Accordingly, good performance of the LED fixing apparatus can be achieved irrespective of aspects of manufacture and operation.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A light-emitting diode (LED) fixing apparatus, comprising:
    a base having a top and four engagement slots formed in two opposite lateral surfaces of the base facing forwards and rearward respectively;
    a first fixing member mounted on the lateral surface of the base facing rearwards and having:
        two first engagement arms formed on and protruding forwards along a longitudinal direction from a lateral surface of the first fixing member facing forwards, spaced apart from each other, and respectively inserted into two of the four engagement slots; and
        a first pressing portion formed on and protruding from the lateral surface of the first fixing member on which the first engagement arms are formed;
    a second fixing member mounted on the lateral surface of the base facing forwards and having:
        two second engagement arms formed on and protruding rearwards from a lateral surface of the second fixing member facing rearwards, spaced apart from each other, and inserted into the other two of the four engagement slots;

a connection port formed on a longitudinal surface of the second fixing member differing from the lateral surface of the second fixing member; and a second pressing portion formed on and protruding forwards from the lateral surface of the second fixing member on which the second engagement arms are formed;

a terminal mounted in the second fixing member and having:

an insertion portion mounted through the connection port of the second fixing member and exposed from an opening of the connection port;

a connection portion having two ends, wherein one end of the connection portion is connected to the insertion portion;

a first terminal portion connected to the other end of the connection portion; and a second terminal portion connected to the insertion portion; and a LED board mounted on the base and having:

a substrate mounted on the base;

an LED die mounted on the substrate; and two electrodes respectively mounted on two opposite portion on the substrate in the longitudinal direction;

wherein the first fixing member and the second fixing member are securely held on two opposite portions of the LED board for the first terminal portion and the second terminal portion to abut against the respective electrodes for supplying power to the LED board through the electrodes.

2. The LED fixing apparatus as claimed in claim 1, wherein the base further has a first bevel block, wherein the first bevel block is formed on and protrudes from a top of the base and descends forwards from the first fixing member to the second fixing member; and the connection portion of the terminal has an ear portion formed on protruding downwards from the connection portion, wherein The ear portion is slidable on the first bevel block when the second fixing member is mounted on the base.

3. The LED fixing apparatus as claimed in claim 2, wherein the ear slot is formed in the top of the base and is adjacent to a rear end of the first bevel block; and the ear portion of the terminal corresponds to the ear slot of the base in position and is inserted into the ear slot after the ear portion slidably passes the first bevel block.

4. The LED fixing apparatus as claimed in claim 3, wherein the base further has a second bevel block, wherein the second bevel block is obliquely formed on the top of the base, is adjacent to the lateral surface of the base facing forwards, descends forwards from the first fixing member to the second fixing member, and is slidable on the second bevel block when the second fixing member is mounted on the base, wherein a rear end of the second bevel block abuts against a front edge portion of the LED board when the first fixing member is mounted on the base.

5. The LED fixing apparatus as claimed in claim 3, wherein the first fixing member further has a first connection arm, wherein the first connection arm are formed on and protrude forwards from the lateral surface of the first fixing member on which the first engagement arms are formed; and the second fixing member further has a second connection arm, wherein the second connection arm are formed on and protrude forwards from the lateral surface of the second fixing member on which the second engagement arms are formed, and is detachably connected with the first connection arm of the first fixing member.

6. The LED fixing apparatus as claimed in claim 3, wherein the first fixing member further has two first positioning portions, wherein the two first positioning portions are formed on and protrude forwards from the lateral surface of the first fixing member on which the first engagement arms are formed, wherein front portions of the first positioning portions abut against a rear edge portion of the LED board when the first fixing member is mounted in the base; and the second fixing member further has two second positioning portions, wherein the two second positioning portions are formed on and protrude forwards from the lateral surface of the second fixing member on which the second engagement arms are formed, wherein front portions of the first positioning portions abut against a rear edge portion of the LED board when the second fixing member is mounted in the base.

7. The LED fixing apparatus as claimed in claim 6, wherein the first fixing member further has a terminal-receiving chamber formed in a bottom of the first pressing portion of the first fixing member, wherein the terminal is received in the terminal-receiving chamber; and one of the first positioning portions of the first fixing member is lower than the first pressing portion and the terminal and the terminal is held between the first pressing portion and the first positioning portion below the first pressing portion.

8. The LED fixing apparatus as claimed in claim 3, wherein the base further has two recesses are formed in a front portion and a rear portion of the top of the base, two of the four engagement slots are formed in a lateral inner wall of the recess in the front portion of the base and another two of the four engagement slots are formed in a lateral inner wall of the recess in the rear portion of the base, wherein the lateral inner walls of the recesses in the front portion and the rear portion of the base correspond to the respective lateral surfaces of the base on which the first fixing member and the second fixing member are respectively mounted, and the first fixing member and the second fixing member are respectively mounted in the recesses in the rear portion and the front portion of the base along the longitudinal direction.

9. The LED fixing apparatus as claimed in claim 3, wherein the base further has four channels formed in a bottom of the base and correspond to and communicate with the respective engagement slots located above the channels.

10. The LED fixing apparatus as claimed in claim 3, wherein the first fixing member has a first positioning hole, the second fixing member has a second positioning hole, and the base has two fastening holes corresponding to the first positioning hole and the second positioning hole respectively.

11. The LED fixing apparatus as claimed in claim 3, wherein the first pressing portion has a first pressing plate formed on and extending forwards from a front end of the first pressing portion, and the first pressing plate is pressed against the LED board when the first fixing member is mounted on the LED board.

12. The LED fixing apparatus as claimed in claim 3, wherein the second pressing portion has a second pressing plate formed on and extending rearwards from a rear end of the second pressing portion, and the second pressing plate is pressed against the LED board when the second fixing member is mounted on the LED board.

* * * * *